（12）United States Patent
Tran et al.

(10) Patent No.: US 9,780,051 B2
(45) Date of Patent: Oct. 3, 2017

(54) METHODS FOR FORMING SEMICONDUCTOR DEVICES WITH STEPPED BOND PADS

(71) Applicants: Tu-Anh N. Tran, Austin, TX (US); Kurt H. Junker, Austin, TX (US)

(72) Inventors: Tu-Anh N. Tran, Austin, TX (US); Kurt H. Junker, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/133,551

(22) Filed: Dec. 18, 2013

(65) Prior Publication Data

US 2015/0171035 A1    Jun. 18, 2015

(51) Int. Cl.
*H01L 21/44* (2006.01)
*H01L 23/00* (2006.01)
(Continued)

(52) U.S. Cl.
CPC ............. *H01L 24/03* (2013.01); *H01L 22/32* (2013.01); *H01L 23/3157* (2013.01); *H01L 24/05* (2013.01); *H01L 24/43* (2013.01); *H01L 24/48* (2013.01); *H01L 24/45* (2013.01); *H01L 24/85* (2013.01); *H01L 2224/02166* (2013.01); *H01L 2224/0391* (2013.01); *H01L 2224/0392* (2013.01); *H01L 2224/03622* (2013.01); *H01L 2224/03831* (2013.01); *H01L 2224/04042* (2013.01); *H01L 2224/05017* (2013.01); *H01L 2224/05124* (2013.01); *H01L 2224/05147* (2013.01); *H01L 2224/05557* (2013.01); *H01L 2224/05558* (2013.01); *H01L 2224/05624* (2013.01); *H01L 2224/05647* (2013.01); *H01L 2224/43* (2013.01); *H01L 2224/45147* (2013.01); *H01L 2224/48453* (2013.01); *H01L 2224/48458* (2013.01); (Continued)

(58) Field of Classification Search
CPC . H01L 2224/73265; H01L 2224/48227; H01L 2224/48465; H01L 2224/48247; H01L 2224/32245; H01L 2224/45147; H01L 2224/45124; H01L 2224/48847; H01L 2224/0391; H01L 2224/04042; H01L 2224/05647; H01L 2224/48507; H01L 2924/01029
USPC ........................................................ 438/612
See application file for complete search history.

(56) References Cited

U.S. PATENT DOCUMENTS 5,751,015 A *  5/1998  Corbett ............. G01R 31/2856
                                                   257/203
6,060,378 A      5/2000  Rolfson
(Continued)

FOREIGN PATENT DOCUMENTS

KR    1020040029863 A    4/2004
KR    1020040056831 A    7/2004

OTHER PUBLICATIONS

European Search Report dated Jan. 7, 2015 for Application No. 14196161.5-1552/2887394.

*Primary Examiner* — Duy T Nguyen (57) ABSTRACT

A method for forming a semiconductor structure includes forming a bond pad over a last metal layer of the semiconductor structure wherein the bond pad includes a wire bond region; and recessing the wire bond region such that the wire bond region has a first thickness and a region of the bond pad outside the wire bond region has a second thickness that is greater than the first thickness.

19 Claims, 8 Drawing Sheets

(51) Int. Cl.
    *H01L 21/66*     (2006.01)
    *H01L 23/31*     (2006.01)

(52) U.S. Cl.
    CPC ........... *H01L 2224/48463* (2013.01); *H01L 2224/48507* (2013.01); *H01L 2224/48824* (2013.01); *H01L 2224/48847* (2013.01); *H01L 2224/85181* (2013.01); *H01L 2224/85365* (2013.01); *H01L 2924/01013* (2013.01); *H01L 2924/01029* (2013.01); *H01L 2924/10253* (2013.01); *H01L 2924/10271* (2013.01); *H01L 2924/10329* (2013.01); *H01L 2924/181* (2013.01)

(56) References Cited

U.S. PATENT DOCUMENTS

| | | | |
|---|---|---|---|
| 6,200,889 B1 | 3/2001 | Rolfson | |
| 6,287,950 B1 * | 9/2001 | Wu | H01L 24/03 257/E21.508 |
| 6,815,324 B2 | 11/2004 | Huang et al. | |
| 6,844,631 B2 | 1/2005 | Yong et al. | |
| 7,115,495 B2 | 10/2006 | Wark et al. | |
| 7,429,795 B2 * | 9/2008 | Su et al. | 257/734 |
| 2005/0077626 A1 | 4/2005 | Seiller | |
| 2005/0104188 A1 * | 5/2005 | Coolbaugh et al. | 257/690 |
| 2005/0173801 A1 * | 8/2005 | Mimura | H01L 22/32 257/758 |
| 2005/0224984 A1 * | 10/2005 | Hortaleza | H01L 24/03 257/762 |
| 2006/0065969 A1 * | 3/2006 | Antol | H01L 23/3171 257/700 |
| 2008/0014732 A1 * | 1/2008 | Li et al. | 438/597 |
| 2008/0111244 A1 * | 5/2008 | Tessmer | H01L 24/05 257/765 |
| 2009/0053887 A1 * | 2/2009 | Lin et al. | 438/617 |
| 2010/0019395 A1 * | 1/2010 | Zecri | H01L 24/03 257/782 |
| 2011/0272801 A1 | 11/2011 | Fiori et al. | |
| 2012/0273954 A1 * | 11/2012 | Higgins, III | 257/762 |
| 2013/0175689 A1 | 7/2013 | Chuang et al. | |

\* cited by examiner

METHODS FOR FORMING SEMICONDUCTOR DEVICES WITH STEPPED BOND PADS

BACKGROUND

Field

This disclosure relates generally to semiconductor devices, and more specifically, to methods for forming semiconductor devices with stepped bond pads.

Related Art

Electronic component packages can include one or more electronic components such as semiconductor processors. Electrically conductive contact with the electronic components can be established with wire bonds formed on bond pads that are connected to circuitry in the electronic components. The assembly of the electronic components with wire bonds is then encapsulated in a protective covering to seal the electronic components from contaminants and protect the wire bonds from breakage.

As the price of gold rises, it becomes more economical to use less costly conductive materials such as copper, aluminum and silver to replace the use of gold in electronic component packages. For example, gold can be replaced with copper and copper alloys for wire bonds while aluminum can be used as bond pads. As the use of copper wire on aluminum pad becomes more common, various performance issues with these materials arise.

In some cases, in order to meet customer requirements and qualify for shipment, electronic component packages are subject to various tests to simulate performance of the packages over time in expected operating environments. One such test involves subjecting the electronic component packages to temperature extremes such as between −50 to 150 degrees Celsius for a specified duration (for example, 30 minutes per cycle) and a specified number of cycles (for example, 2000 cycles). As the size of the electronic components is continually decreasing and the number of the electronic components in a package is ever-increasing, reliability issues can arise that previously were not an issue with larger wire sizes, larger ball bond sizes and fewer components. For example, as wire size and ball bond size for the wire bonds get smaller, the temperature cycling can cause cracks between the aluminum bond pad and an intermetallic compound at the interface between the copper wire bond and the aluminum bond pad. The cracks can be severe enough to destroy the connection to the circuitry coupled to the bond pad.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of methods for manufacturing a semiconductor device with stepped bond pads are provided. The stepped bond pads have a wire bond region with a thickness that is less than the thickness of the remaining portion of the bond pad outside the wire bond region. All or a majority of the thinner region of material is consumed to form an intermetallic compound when the wire bond is formed. The intermetallic compound is less susceptible to cracking during temperature cycling than the material of the bond pad alone. Therefore a more reliable connection between the wire bond and circuitry underlying the bond pad is formed while the thicker (unstepped) portion of the bond pad provides improved conductivity.

Figure 1:
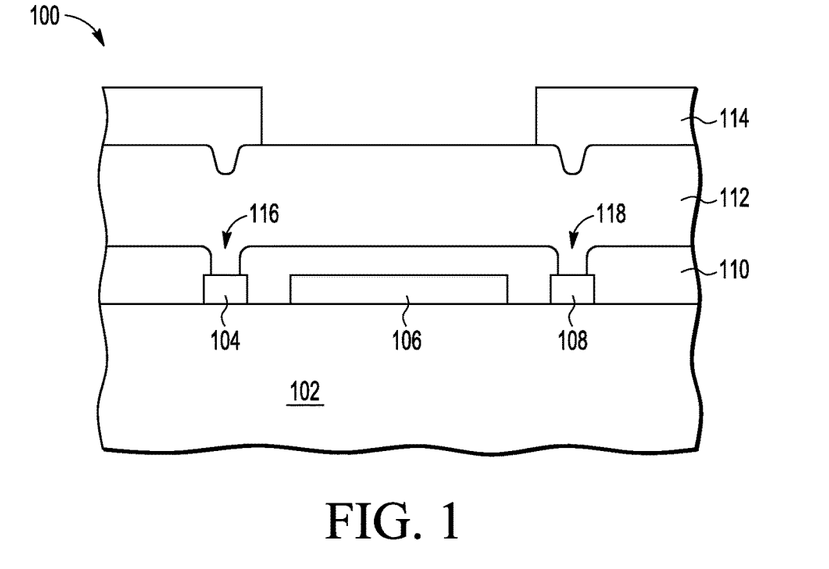
FIG. 1 is a cross-sectional view of an embodiment of a semiconductor device during an intermediate stage of manufacture.

FIG. 1 is a cross-sectional view of an embodiment of a semiconductor device 100 during an intermediate stage of manufacture. Device 100 includes a substrate (not shown) on which active circuitry (not shown), interconnect layers 102, last metal layer traces 104, 106, 108, dielectric or passivation layer 110, bond pad 112 and a patterned masking layer 114.

The substrate can be any semiconductor material or combination of materials, such as gallium arsenide, silicon germanium, silicon-on-insulator (SOI), silicon, monocrystalline silicon, the like, and combinations of the above. Electronic circuitry (not shown) can be formed on the substrate and one or more layers of electrically conductive interconnections alternating with dielectric layers (not shown) can be formed above the circuitry. Last metal layer traces 104-108 are coupled to respective portions of the circuitry via the interconnect layers 102. Bond pad 112 can be formed of aluminum, copper, and/or other suitable materials, or combinations thereof. Traces 104-108 can be made of aluminum, copper, and/or other electrically conductive materials, as well as alloys of aluminum, copper, and/or other conductive materials. Passivation layer 110 is patterned with openings 116, 118 over traces 104, 108 to allow bond pad 112 to directly contact last metal layer traces 104 and 108. Passivation layer 110 may be formed of nitride, silicon oxide, silicon oxynitride, and/or other suitable dielectric material that contains glass.

A masking layer such as photoresist is deposited over bond pad 112 and patterned to form patterned masking layer 114 over a selected portion of bond pad 112. In particular, an unmasked portion of bond pad 112 is positioned in a region of bond pad 112 where a wire bond will be formed. The dimension of the unmasked portion is typically sized no larger than necessary to accommodate the wire bond and optionally large enough to also accommodate a splash portion of bond pad 112 that forms around the periphery of the wire bond when the wire bond is pushed into and displaces a portion of bond pad 112. Dielectric layer 110 can have a thickness ranging from 2000 to 12,000 Angstroms, or other suitable thickness. Bond pad 112 can have an initial thickness ranging from 1 to 3 microns, or other suitable thickness.

Figure 2:
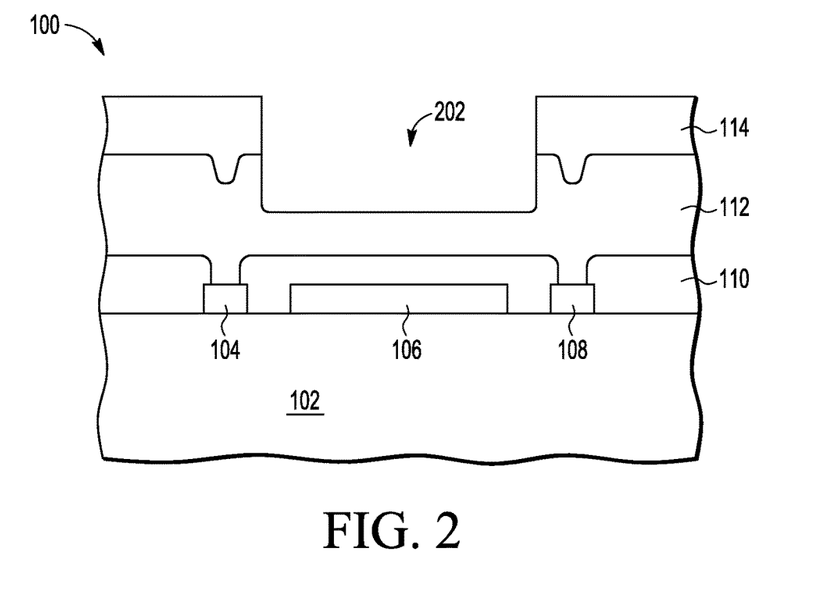
FIG. 2 is a cross-sectional view of the semiconductor device of FIG. 1 after a subsequent stage of manufacture.

FIG. 2 is a cross-sectional view of the semiconductor device 100 of FIG. 1 after a subsequent stage of manufacture during which the unmasked portion of bond pad 112 is recessed, etched, or removed to form a stepped portion 202 in bond pad 112. The thickness of stepped portion 202 can range from 30 to 60 percent of the initial thickness of bond pad 112. For example, bond pad 112 can have an initial thickness of 2.8 microns while the thickness of stepped portion 202 can have a thickness of 1.4 microns. Other suitable combinations of thicknesses for the initial thickness of bond pad 112 and stepped portion 202 can be used, however.

One feature to note is that the initial thickness of the unetched portions of bond pad 112 keeps the resistance of the bond pad 112 lower. The stepped portion 202 of bond pad 112 is formed to help prevent cracks from forming between a subsequent wire bond (not shown) and the bond pad 112.

Figure 3:
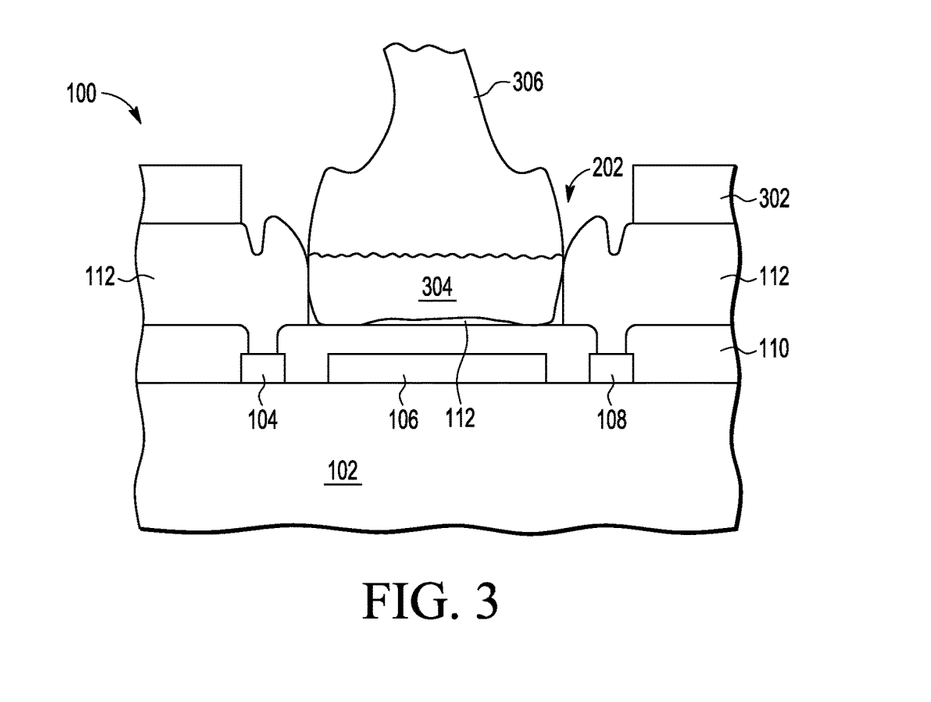
FIG. 3 is a cross-sectional view of the semiconductor device of FIG. 2 after a subsequent stage of manufacture.

FIG. 3 is a cross-sectional view of the semiconductor device 100 of FIG. 2 after a subsequent stage of manufacture during which masking layer 114 (FIG. 2) is removed and a patterned passivation layer 302 is formed over the unetched portion of bond pad 112. A wire bond 306 is subsequently formed in the stepped portion 202 of bond pad 112. When wire bond 306 is formed, almost the entire thickness of stepped portion 202 becomes part of an intermetallic compound 304 that includes material from the wire bond 306 and underlying material from stepped portion 202 of bond pad 112. The intermetallic compound 304 has a higher Young's modulus and is less susceptible to cracking than the material used for bond pad 112. Thus, stepped portion 202 helps maintain a reliable connection between the wire bond and traces 104, 108 while the unetched portion of bond pad 112 helps lower the resistance of bond pad 112.

Figure 4:
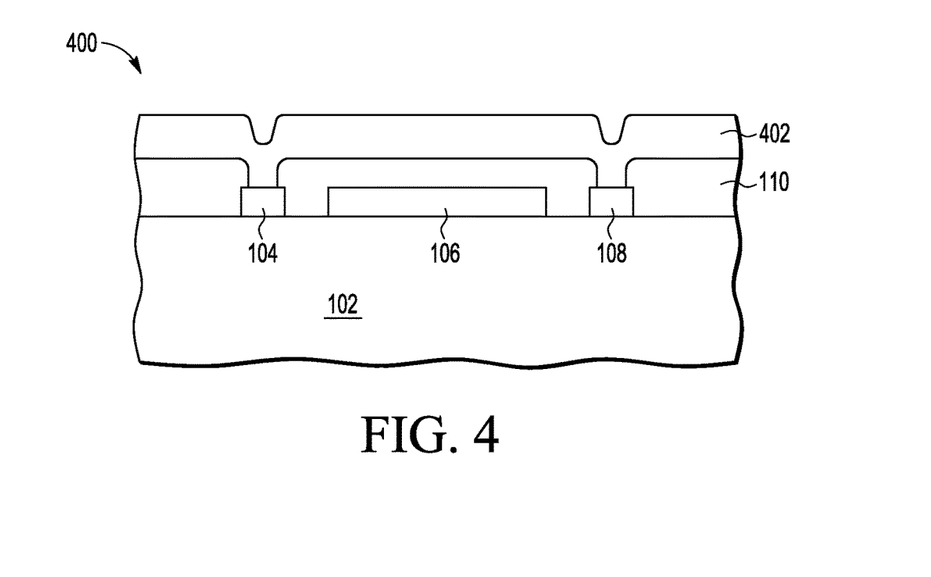
FIG. 4 is a cross-sectional view of another embodiment of a semiconductor device during an intermediate stage of manufacture.

FIG. 4 is a cross-sectional view of another embodiment of a semiconductor device 400 during an intermediate stage of manufacture. As shown, device 400 includes a substrate (not shown) on which active circuitry (not shown), interconnect layers 102, last metal layer traces 104, 106, 108, dielectric or passivation layer 110, and bond pad 402 are formed. The thickness of bond pad 402 is selected to be approximately one-half the thickness desired for reliable signal conductivity, and a portion of bond pad 402 is removed so that all or most of the material of bond pad 402 in a wire bond region is consumed and becomes part of an intermetallic compound when the wire bond is formed. In one example, the thickness of bond pad 402 is 1.4 microns, but can be any other suitable thickness. Bond pad 402 can be formed of aluminum, copper, and/or other suitable materials, or combinations thereof.

Figure 5:
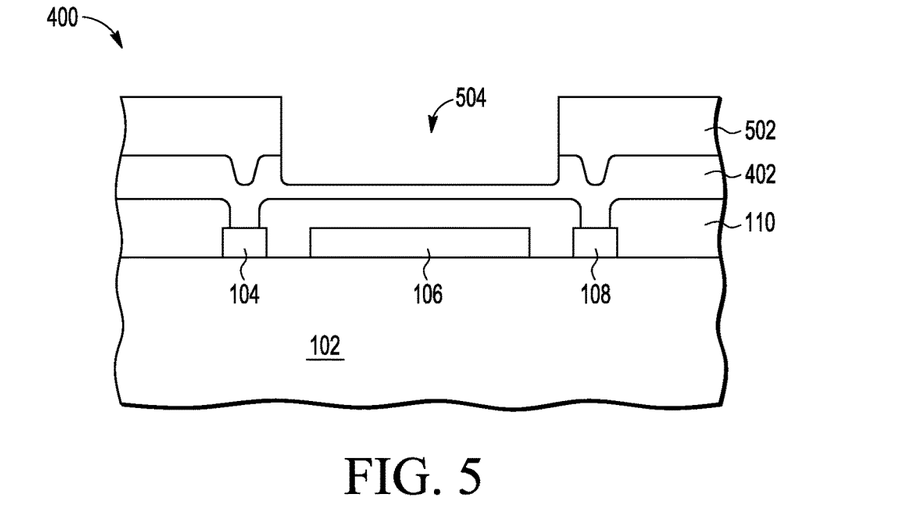
FIGS. 5-7 are cross-sectional views of the semiconductor device of FIG. 4 during subsequent stages of manufacture.

FIG. 5 is a cross-sectional view of the semiconductor device 400 of FIG. 4 after a subsequent stage of manufacture in which a patterned mask layer 502 is formed over bond pad 402 and an unmasked portion of bond pad 402 is etched to form a stepped region 504 where a wire bond will be subsequently formed. The thickness of stepped portion 504 can range from 10 to 30 percent of the initial thickness of bond pad 402. For example, bond pad 402 can have an initial thickness of 1.4 microns while the thickness of stepped portion 504 can have a thickness of 0.5 microns. Other suitable combinations of thicknesses for the initial thickness of bond pad 402 and stepped portion 504 can be used, however.

Figure 6:
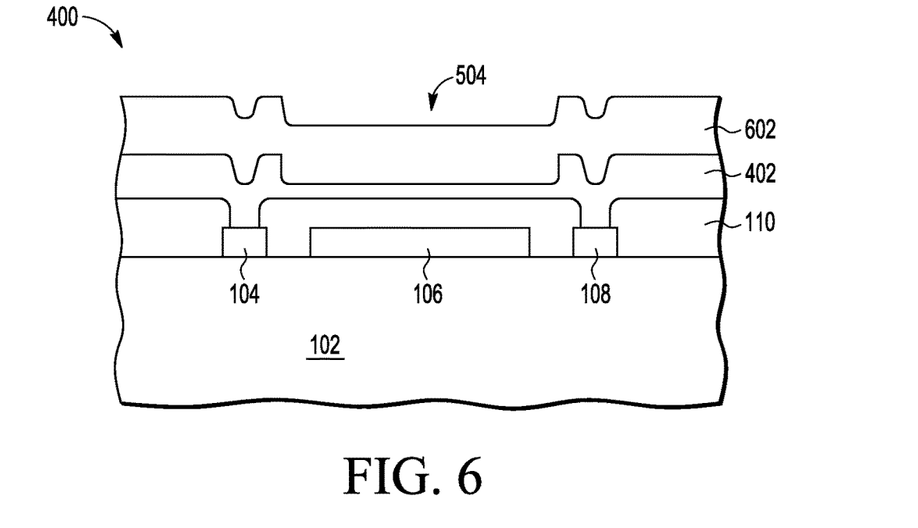

FIG. 6 is a cross-sectional view of the semiconductor device 400 of FIG. 5 after a subsequent stage of manufacture in which patterned masking layer 502 is removed and another layer of bond pad 602 is deposited over bond pad 402. The material for bond pad 602 can be the same as the material for bond pad 402. The thickness of bond pad 602 can be the same as the initial (unetched) thickness of bond pad 402, or other suitable thickness. Bond pad 602 is deposited conformally over bond pad 402 and thus also includes stepped region 504 where a wire bond will be subsequently formed.

Figure 7:
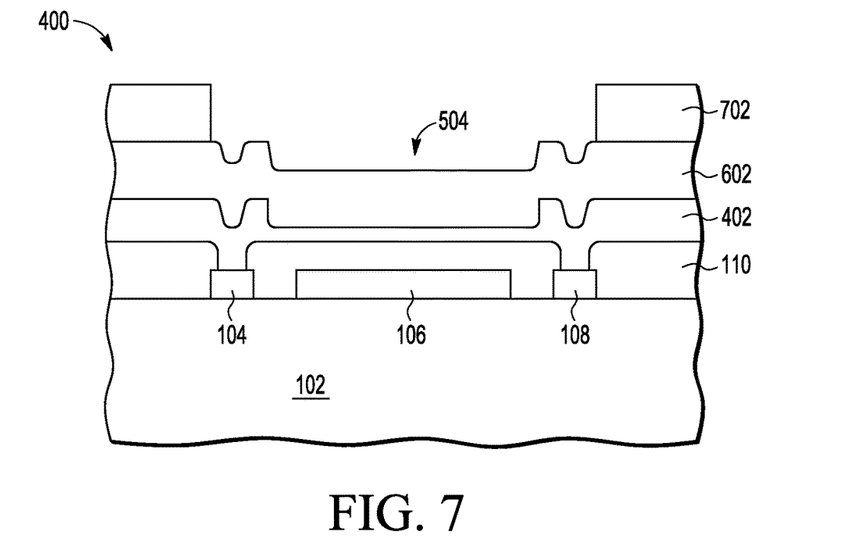

FIG. 7 is a cross-sectional view of the semiconductor device 400 of FIG. 6 after a subsequent stage of manufacture in which passivation layer 702 is patterned over unstepped regions of bond pad 602. A wire bond (not shown) can be subsequently formed in the stepped portion 504 of bond pad 602.

The stepped portion 504 of bond pads 402/602 helps prevent cracks from forming between a subsequent wire bond (not shown) and the bond pad 402/602. When the wire bond is formed, almost the entire thickness of stepped portion 504 becomes part of an intermetallic compound that includes material from the wire bond and underlying material from stepped portion 504 of bond pad 402/602. The intermetallic compound is less susceptible to cracking than the material used for bond pad 402. Thus, stepped portion 504 helps maintain a reliable connection between the wire bond and traces 104, 108 while the unetched portion of bond pad 402/602 helps lower the resistance of bond pad 402/602.

Figure 8:
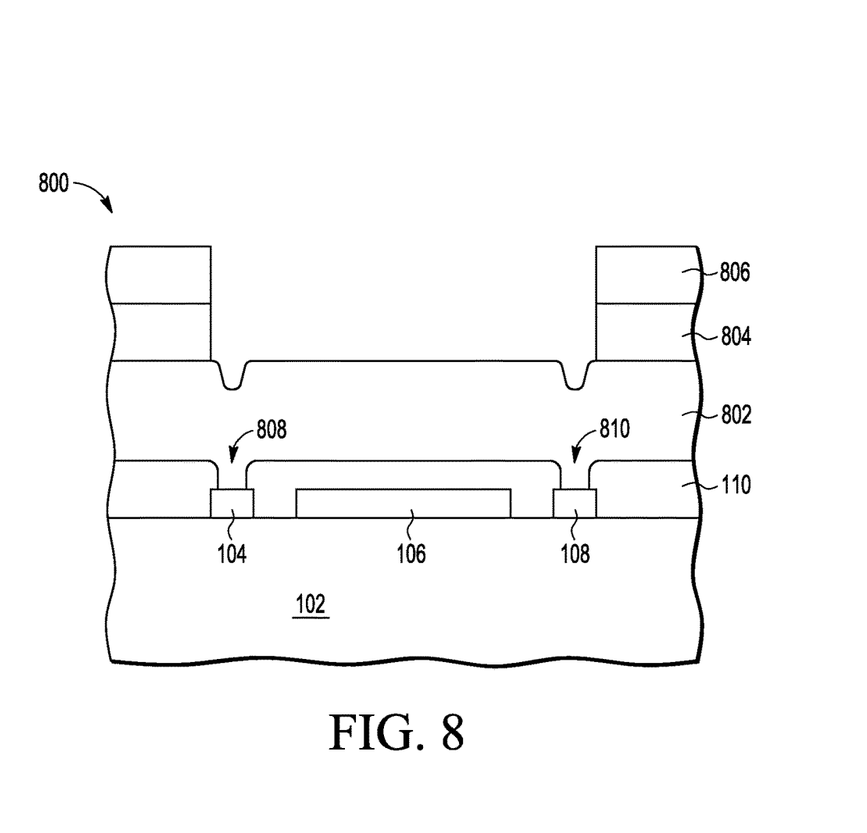
FIG. 8 is a cross-sectional view of another embodiment of a semiconductor device during an intermediate stage of manufacture.

FIG. 8 is a cross-sectional view of another embodiment of a semiconductor device 800 during an intermediate stage of manufacture. As shown, device 800 includes a substrate (not shown) on which active circuitry (not shown), interconnect layers 102, last metal layer traces 104, 106, 108, patterned dielectric or passivation layer 110, bond pad 802, patterned passivation layer 804, and patterned mask layer 806 are formed. Bond pad 802 can be formed of aluminum, copper, and/or other suitable materials, or combinations thereof.

Masking layer 806 is patterned to cover the top of passivation layer 804 to protect passivation layer 804 during subsequent processing. Masking layer 806 can be photoresist or other suitable material, and may be optional depending on whether subsequent processing is likely to degrade passivation layer 804.

Masking layer 806 and passivation layer 804 are patterned over a selected portion of bond pad 802. In particular, an unmasked portion of bond pad 802 is positioned in a region where a wire bond will be formed on bond pad 802. The dimension of the unmasked portion is typically sized no larger than necessary to accommodate the wire bond and optionally large enough to also accommodate a splash portion of bond pad 802 that forms around the periphery of the wire bond when the wire bond is pushed into and displaces a portion of bond pad 802. Passivation layer 804 can have a thickness ranging from 2000 to 12,000 Angstroms, or other suitable thickness. Bond pad 802 can have an initial thickness ranging from 1 to 3 microns, or other suitable thickness.

Figure 9:
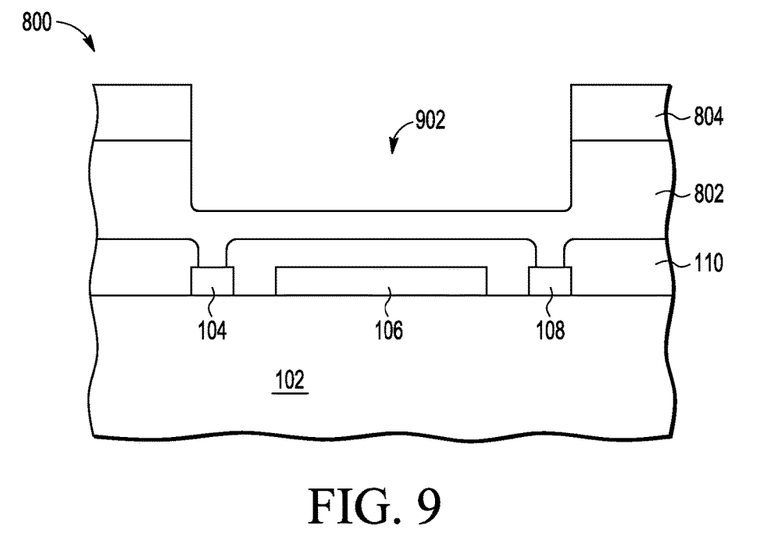
FIG. 9 is a cross-sectional view of the semiconductor device of FIG. 8 after subsequent stages of manufacture.

FIG. 9 is a cross-sectional view of the semiconductor device 800 of FIG. 8 after a subsequent stage of manufacture during which the unmasked portion of bond pad 802 is etched or recessed to form wire bond region 902. The original thickness of bond pad 802 remains under the masked portions of bond pad 802 while the thickness of bond pad 802 is reduced in wire bond region 902. Masking layer 806, if used, is also removed.

A wire bond (not shown) can be subsequently formed in the stepped or recessed wire bond region 902 of bond pad 802. When the wire bond is formed, almost the entire thickness of recessed wire bond region 902 becomes part of an intermetallic compound that includes material from the wire bond and underlying material from bond pad 802. The intermetallic compound is less susceptible to cracking than the material used for bond pad 802. Thus, stepped wire bond region 902 helps maintain a reliable connection between the wire bond and traces 104, 108 while the unetched portion of bond pad 802 helps lower the resistance of bond pad 802.

Figure 10:
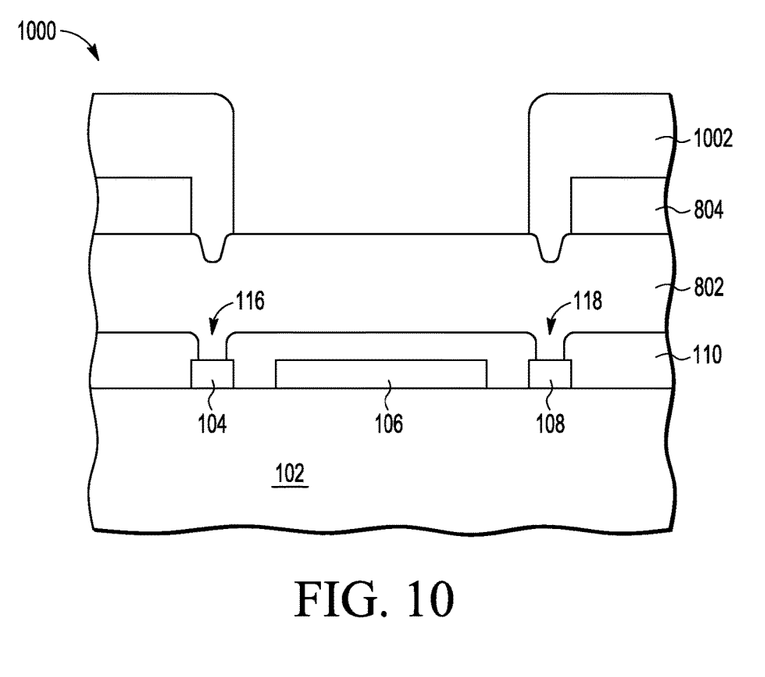
FIG. 10 is a cross-sectional view of another embodiment of a semiconductor device during an intermediate stage of manufacture.

FIG. 10 is a cross-sectional view of another embodiment of a semiconductor device 1000 during an intermediate stage of manufacture. As shown, device 1000 includes a substrate (not shown) on which active circuitry (not shown), interconnect layers 102, last metal layer traces 104, 106, 108, patterned dielectric or passivation layer 110, bond pad 802, patterned passivation layer 804, and patterned mask layer 1002 are formed. Bond pad 802 can be formed of aluminum, copper, and/or other suitable materials, or combinations thereof. Passivation layer 110 is patterned with openings 116, 118 over traces 104, 108 to allow bond pad 802 to directly contact last metal layer traces 104 and 108. Passivation layer 804 may be formed of nitride, silicon oxide, silicon oxynitride, and/or other suitable dielectric material that contains glass. Masking layer 1002 is patterned to cover all exposed areas of passivation layer 804 to protect passivation layer 804 during subsequent processing. Masking layer 1002 can be photoresist or other suitable material, and may be optional depending on whether subsequent processing is likely to degrade passivation layer 804.

Masking layer 1002 and passivation layer 804 are patterned over a selected portion of bond pad 802. In particular, an unmasked portion of bond pad 802 is positioned in a region where a wire bond will be formed on bond pad 802. The dimension of the unmasked portion is typically sized no larger than necessary to accommodate the wire bond and optionally large enough to also accommodate a splash portion of bond pad 802 that forms around the periphery of the wire bond when the wire bond is pushed into and displaces a portion of bond pad 802. Passivation layer 804 can have a thickness ranging from 2000 to 12,000 Angstroms, or other suitable thickness. Bond pad 802 can have an initial thickness ranging from 1 to 3 microns, or other suitable thickness.

Figure 11:
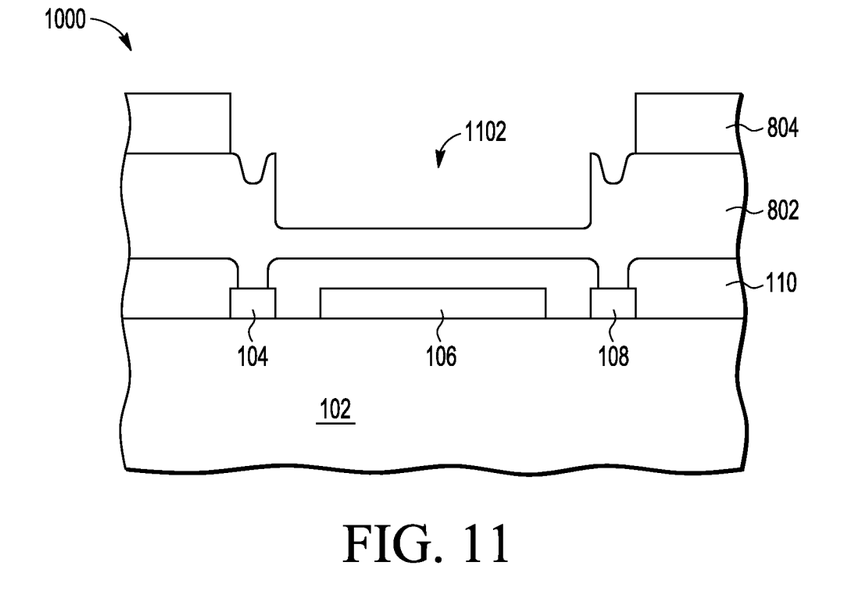
FIG. 11 is a cross-sectional view of the semiconductor device of FIG. 10 after subsequent stages of manufacture.

FIG. 11 is a cross-sectional view of the semiconductor device 1000 of FIG. 10 after a subsequent stage of manufacture during which the unmasked portion of bond pad 802 is etched or recessed to form wire bond region 1102. The initial thickness of bond pad 802 remains under the masked portions of bond pad 802 while the thickness of bond pad 802 is reduced in unmasked wire bond region 1102 after the etching or recessing is completed.

A wire bond (not shown) can be subsequently formed in the stepped or recessed wire bond region 1102 of bond pad 802. When the wire bond is formed, almost the entire remaining thickness of recessed wire bond region 1102 becomes part of an intermetallic compound that includes material from the wire bond and underlying material from bond pad 802. The intermetallic compound is less susceptible to cracking than the material used for bond pad 802. Thus, stepped wire bond region 1102 helps maintain a reliable connection between the wire bond and traces 104, 108 while the unetched portion of bond pad 802 helps lower the resistance of bond pad 802.

Figure 12:
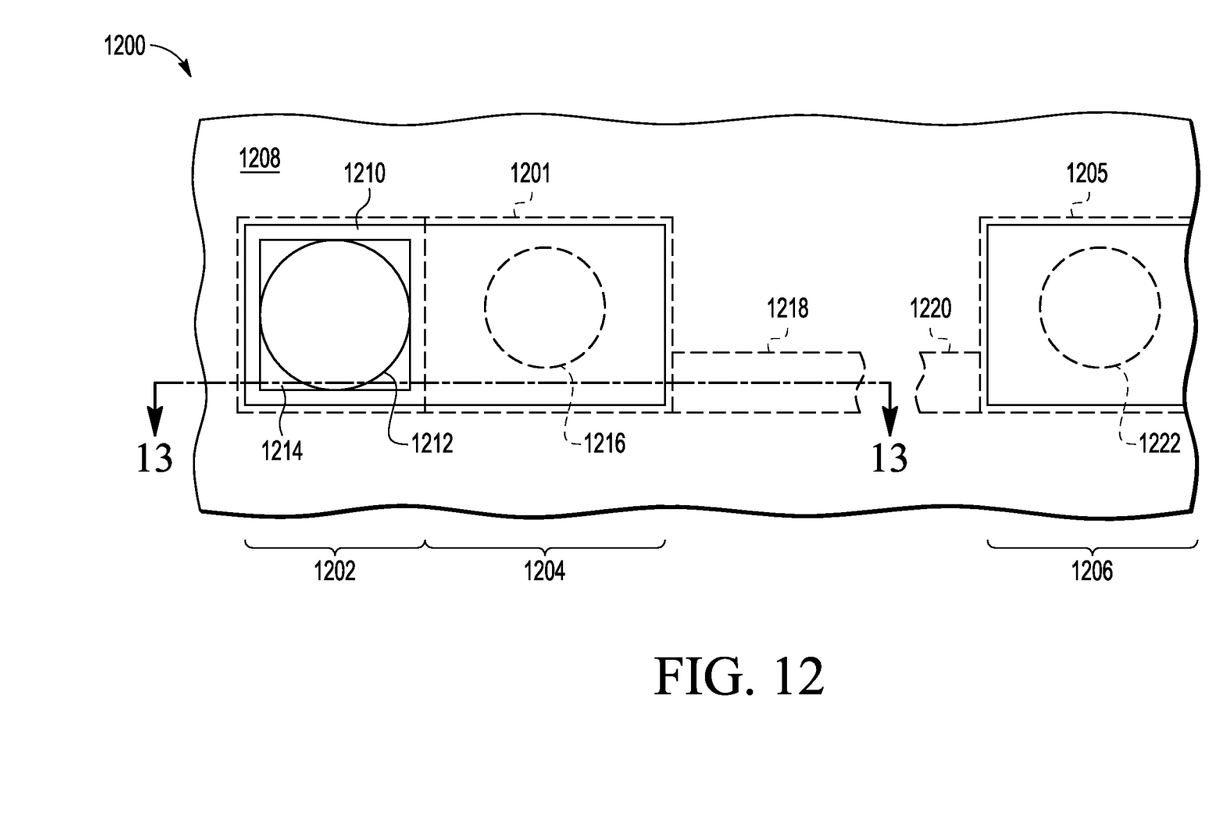
FIG. 12 is a top view of an embodiment of a semiconductor device with a stepped bond pad.

FIG. 12 is a top view of an embodiment of a semiconductor structure 1200 with a bond pad 1201 having first stepped bond pad region 1202 and probe pad region 1204 and a second bond pad 1205 having probe pad region 1206 and bond pad region (not shown). Passivation layer 1208 is deposited and patterned over the top surface of structure 1200 including non-recessed edge portions 1210 of bond pad region 1202 and probe pad regions 1204, 1206. An inner portion of bond pad region 1202 and probe pad regions 1204, 1206 are not covered by passivation layer 1208 so that a wire bond 1212 can be formed in the stepped or recessed portion 1214 of bond pad region 1202 and a test probe can contact probe area 1216 in probe pad regions 1204, 1206 during testing. Conductive routing line 1218 is connected to first bond pad 1201 and conductive routing line 1220 is connected to second bond pad 1205. The conductive routing lines 1218, 1220 can be connected to other components in structure 1200 such as power lines (not shown), input/output pads (not shown), or other components.

Figure 13:
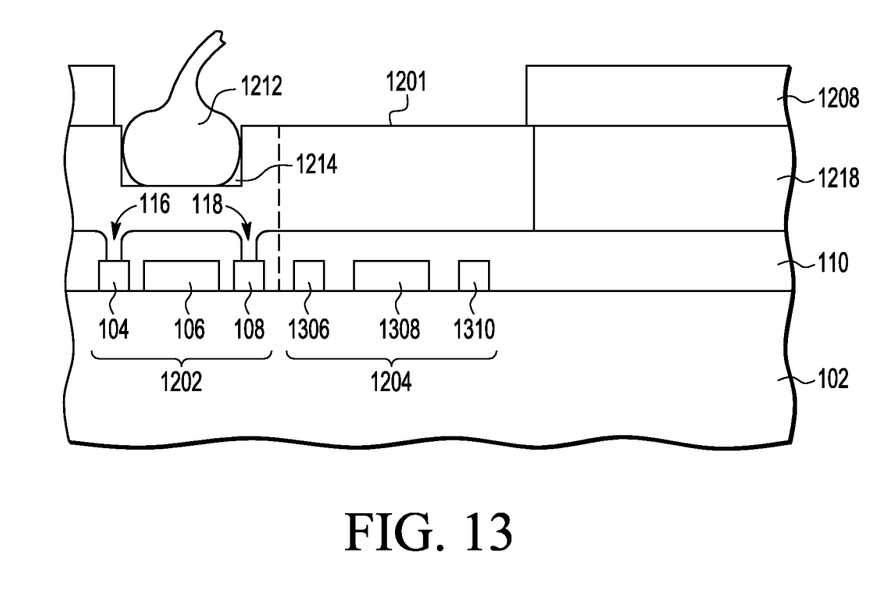
FIG. 13 is a cross-sectional view of a portion of the semiconductor device of FIG. 12.

FIG. 13 is a cross-sectional view of a portion of the semiconductor device 1200 of FIG. 12 that shows wire bond 1212 in recessed or stepped portion 1214 of bond pad region 1202. During processing, a patterned masking layer can be used to mask all the area of bond pad 1201 except recessed wire bond region 1214. Device 1200 includes a substrate (not shown) on which active circuitry (not shown), interconnect layers 102, last metal layer traces 104, 106, 108, 1306, 1308, 1310, patterned dielectric or passivation layer 110, bond pad 1201, routing line 1218 and patterned passivation layer 1208 are formed. Bond pad 1201 and routing line 1218 can be formed of aluminum, copper, and/or other suitable conductive materials, or combinations thereof. Passivation layer 110 is patterned with openings 116, 118 over traces 104, 108 to allow bond pad 1201 to directly contact last metal layer traces 104 and 108. Passivation layer 1208 may be formed of nitride, silicon oxide, silicon oxynitride, and/or other suitable dielectric material that contains glass. Last metal traces 1306-1310 can be connected to other components (not shown) in device 1200. Routing lines 1218, 1220 can have the same thickness as the initial thickness of bond pad 1201, 1205, or other suitable thickness, thus improving the ability of routing lines 1218 and 1220 to conduct signals reliably over relatively long distances.

By now it should be appreciated that in some embodiments, there has been provided methods for forming a semiconductor structure that can include forming a bond pad (112) over a last metal layer (104, 106, 108) of the semiconductor structure. The bond pad can be connected to a portion of the last metal layer, and the bond pad can include a wire bond region. The wire bond region (202, 504, 902, 1102, 1214) can be recessed such that the wire bond region has a first thickness and a region of the bond pad outside the wire bond region has a second thickness that is greater than the first thickness.

In another aspect, the wire bond region can be recessed such that the first thickness is at most 60% of the second thickness.

In another aspect, a passivation layer (302, 502, 804) can be formed over the bond pad and last metal layer, and an opening can be formed in the passivation layer to expose the wire bond region.

In another aspect, recessing the wire bond region can include performing an etch of the wire bond region using the passivation layer (502) as a masking layer. (FIG. 5)

In another aspect, the method can further comprise forming a patterned masking layer (806) over the passivation layer (804). The patterned masking layer can define a location of the opening, and forming the opening in the passivation layer can be performed using the patterned masking layer.

In another aspect, recessing the wire bond region can further comprise etching the wire bond region using the patterned masking layer (806). (FIGS. 8 and 9).

In another aspect, the method can further comprise forming a patterned masking layer (1002) over the passivation layer having a second opening which exposes the wire bond region. Recessing the wire bond region can comprise etching the wire bond region using the patterned masking layer.

In another aspect, the method can further comprise forming a second conductive layer (602) over the bond pad.

In another aspect, the bond pad can be further characterized as an aluminum bond pad.

In another aspect, the method can further comprise attaching a wire bond (1304) to the wire bond region.

In another aspect, the bond pad can further include a probe region (1216), wherein, after the recessing the wire bond region, the probe region has the second thickness.

In another aspect, the semiconductor structure can further comprise conductive routing portions (1218, 1220) over the last metal layer, wherein the conductive routing portions have the second thickness.

In another aspect, the method can further comprise forming a passivation layer (1208) over the bond pad and last metal layer; and forming an opening in the passivation layer to expose the wire bond region such that the passivation layer remains over the conductive routing portions.

In another embodiment, a method for forming a semiconductor structure can comprise forming a bond pad (112) over a last metal layer (104, 106, 108) of the semiconductor structure, wherein the bond pad is connected to a portion of the last metal layer, and the bond pad includes a wire bond region and a probe region. The wire bond region (502, 504, 902, 1102, 1202) is recessed such that the wire bond region has a first thickness and the probe region has a second thickness that is greater than the first thickness.

In another aspect, recessing the wire bond region can be performed such that the first thickness is at most 60% of the second thickness.

In another aspect, the method can further comprise forming a passivation layer (804) over the bond pad and last metal layer; and forming an opening in the passivation layer to expose the wire bond region and the probe region.

In another aspect, the method can further comprise forming a first patterned masking layer (806) over the passivation layer, wherein the first patterned masking layer defines a location of the opening, and forming the opening in the passivation layer is performed using the first patterned masking layer.

In another aspect, the method can further comprise forming a second patterned masking layer (1002) over the passivation layer having a second opening which exposes the wire bond region and does not expose the probe region. Recessing the wire bond region can comprise etching the wire bond region using the second patterned masking layer while the second patterned masking layer protects the probe region.

In another aspect, the bond pad can be further characterized as an aluminum bond pad.

In another aspect, the semiconductor structure can further comprise conductive routing portions (1218, 1220) over the last metal layer, wherein the conductive routing portions have the second thickness.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a semiconductor structure, the method comprising:
    forming a bond pad over a last metal layer of the semiconductor structure, wherein the bond pad is connected to a portion of the last metal layer, and the bond pad includes a wire bond region and a probe region; and
    recessing the wire bond region such that the entire wire bond region has a first thickness and the entire probe region of the bond pad has a second thickness that is greater than the first thickness, wherein the first thickness is selected so that almost all of the bond pad in the wire bond region becomes part of an intermetallic compound during wire bonding; and
    forming a wire bond in the wire bond region, wherein the probe region is outside the wire bond and the wire bond region and is not covered by a passivation layer.

2. The method of claim 1, wherein the recessing the wire bond region is performed such that the first thickness is at most 60% of the second thickness.

3. The method of claim 1, further comprising:
    forming the passivation layer over the bond pad and last metal layer; and
    forming an opening in the passivation layer to expose the wire bond region.

4. The method of claim 3, wherein the recessing the wire bond region comprises performing an etch of the wire bond region using the passivation layer as a masking layer.

5. The method of claim 3, further comprising:
    forming a patterned masking layer over the passivation layer, wherein the patterned masking layer defines a location of the opening, and wherein the forming the opening in the passivation layer is performed using the patterned masking layer.

6. The method of claim 5, wherein the recessing the wire bond region comprises performing an etch of the wire bond region using the patterned masking layer.

7. The method of claim 3, further comprising:
forming a patterned masking layer over the passivation layer having a second opening which exposes the wire bond region, wherein the recessing the wire bond region comprises performing an etch of the wire bond region using the patterned masking layer.

8. The method of claim 1, further comprising:
forming a second conductive layer over the bond pad.

9. The method of claim 1, wherein the bond pad is further characterized as an aluminum bond pad.

10. The method of claim 1, further comprising:
attaching a copper wire bond to the wire bond region.

11. The method of claim 1, wherein the semiconductor structure further comprises conductive routing portions over the last metal layer, wherein the conductive routing portions have the second thickness.

12. The method of claim 11, further comprising:
forming the passivation layer over the bond pad and last metal layer; and
forming an opening in the passivation layer to expose the wire bond region such that the passivation layer remains over the conductive routing portions.

13. A method for forming a semiconductor structure, the method comprising:
forming a bond pad over a last metal layer of the semiconductor structure, wherein the bond pad is connected to a portion of the last metal layer, and the bond pad includes a wire bond region and a probe region outside the wire bond region;
determining a first thickness of the bond pad over the wire bond region so that a majority of the bond pad in the wire bond region is consumed in an intermetallic compound during wire bonding;
recessing the wire bond region such that the entire wire bond region has the first thickness, and the entire probe region a second thickness that is greater than the first thickness; and
forming a wire bond in the wire bond region, wherein the probe region is accessible by a test probe after the wire bond is formed.

14. The method of claim 13, wherein the recessing the wire bond region is performed such that the first thickness is between 30 and 60% of the second thickness.

15. The method of claim 13, further comprising:
forming a passivation layer over the bond pad and last metal layer; and
forming an opening in the passivation layer to expose the wire bond region and the probe region.

16. The method of claim 15, further comprising:
forming a first patterned masking layer over the passivation layer, wherein the first patterned masking layer defines a location of the opening, and wherein the forming the opening in the passivation layer is performed using the first patterned masking layer.

17. The method of claim 16, further comprising:
forming a second patterned masking layer over the passivation layer having a second opening which exposes the wire bond region and does not expose the probe region, wherein the recessing the wire bond region comprises performing an etch of the wire bond region using the second patterned masking layer while the second patterned masking layer protects the probe region.

18. The method of claim 13, wherein the bond pad is further characterized as an aluminum bond pad, and a wire bond of the wire bonding is further characterized as copper wire.

19. The method of claim 13, wherein the semiconductor structure further comprises conductive routing portions over the last metal layer, wherein the conductive routing portions have the second thickness.

* * * * *